US008416116B2

(12) United States Patent
Chang et al.

(10) Patent No.: US 8,416,116 B2
(45) Date of Patent: Apr. 9, 2013

(54) SUCCESSIVE APPROXIMATION ANALOG-TO-DIGITAL CONVERTER HAVING AUXILIARY PREDICTION CIRCUIT AND METHOD THEREOF

(75) Inventors: Soon-Jyh Chang, Tainan (TW);
Chun-Cheng Liu, Tainan (TW);
Guan-Ying Huang, Tainan (TW)

(73) Assignee: National Cheng Kung University, Tainan (TW)

( * ) Notice: Subject to any disclaimer, the term of this patent is extended or adjusted under 35 U.S.C. 154(b) by 94 days.

(21) Appl. No.: 13/052,462

(22) Filed: Mar. 21, 2011

(65) Prior Publication Data
US 2012/0154194 A1   Jun. 21, 2012

(51) Int. Cl.
*H03M 1/12* (2006.01)
(52) U.S. Cl. ....................... 341/172; 341/155
(58) Field of Classification Search .................. 341/158, 341/155, 159, 139, 150, 172
See application file for complete search history.

(56) References Cited

U.S. PATENT DOCUMENTS 7,965,218 B2 *  6/2011  Ohnhaeuser et al. ......... 341/172

OTHER PUBLICATIONS

Chun-Cheng Liu et al. "A 1V11fJ/Conversion-Step 10bit 10MS/s Asynchronous SAR ADC in 0.18 μm CMOS" 2010 Symposium on VLSI Circuits/Technical Digest of Technical Papers Jun. 18, 2010, pp. 241-242.

* cited by examiner

*Primary Examiner* — Joseph Lauture
(74) *Attorney, Agent, or Firm* — Volpe and Koenig, P.C.

(57) ABSTRACT

The configurations and adjusting method of a successive approximation analog-to-digital converter (SAR ADC) are provided. The provided SAR ADC includes at least one capacitor with a first and a second terminals, and a plurality of bits, each of which is connected to the at least one capacitor, wherein the first terminal receives an input signal, and the second terminal selectively receives one of a first and a second reference voltages, and a first comparator receiving an adjustable third reference voltage and a first voltage value generated by the input signal, wherein a connection of the second terminal of each the capacitor of the capacitor array is switched when the first voltage value is larger than the third reference voltage.

14 Claims, 8 Drawing Sheets

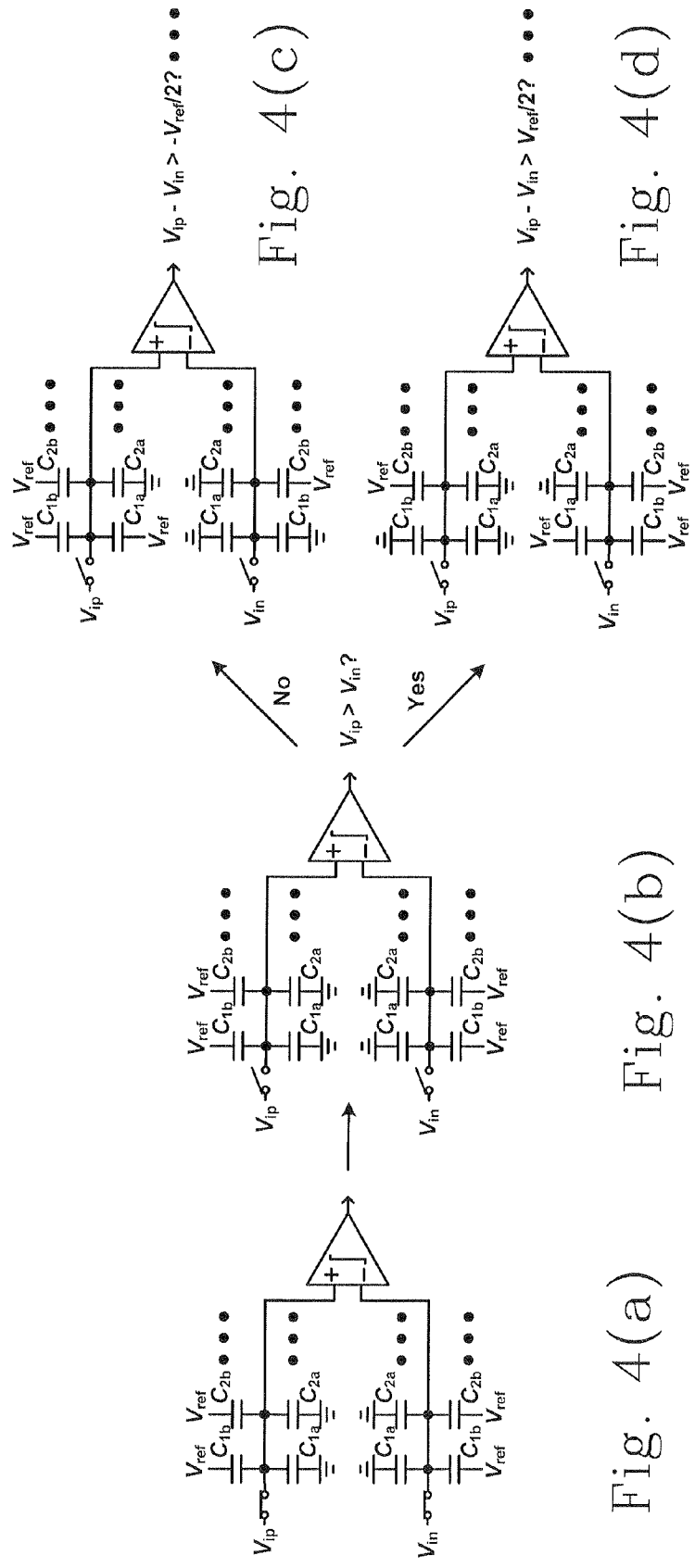

|  | $B_{xp}$ | $\overline{B_{xn}}$ | State |
|---|---|---|---|
| $V_{ip} > V_r$<br>$V_{in} < V_r$ | 1 | 1 | Switching |
| $V_{ip} > V_r$<br>$V_{in} > V_r$ | 1 | 0 | No Switching |
| $V_{ip} < V_r$<br>$V_{in} > V_r$ | 0 | 0 | Switching |

Fig. 6(b)

$$\begin{array}{c}\overline{B_{1n}}\ \overline{B_{2n}}\ \overline{B_{3n}}\ \overline{B_{4n}}\ B_5\ B_6\ B_7\ B_8\ B_9\ B_{10}\\ +\ B_{1p}\ B_{2p}\ B_{3p}\ B_{4p}\\ \hline D_1\ D_2\ D_3\ D_4\ D_5\ D_6\ D_7\ D_8\ D_9\ D_{10}\end{array}$$

SUCCESSIVE APPROXIMATION ANALOG-TO-DIGITAL CONVERTER HAVING AUXILIARY PREDICTION CIRCUIT AND METHOD THEREOF

FIELD OF THE INVENTION

The application claims the benefit of Taiwan Patent Application No. 099144331, filed on Dec. 16, 2010, in the Taiwan Intellectual Property Office, the disclosures of which are incorporated herein in their entirety by reference.

The present invention relates to a successive approximation analog-to-digital converter (SAR ADC). More particularly, it relates to a SAR ADC comprising an auxiliary prediction circuit having a variable window function.

BACKGROUND OF THE INVENTION

Conventionally, the SAR ADCs employ the binary search algorithms to obtain digital output codes matched with the input signal. During the conversion procedure, the digital-to-analog converter (DAC) in the SAR ADC circuit would add or subtract a binary-weighted voltage, and the difference between the input signal and the reference voltage would be less than a least significant bit (LSB) after the last bit cycle is ended. However, a large voltage might be added to an originally small voltage difference during the procedure such that the voltage difference needs to be decreased slowly and this will result in many unnecessary power losses and waste energy. Thus, an auxiliary prediction circuit having a variable window function is employed to avoid unnecessary capacitor switching to effectively decrease the power consumption of circuit, and the required extra hardware costs are also relatively low.

Keeping the drawbacks of the prior arts in mind, and employing experiments and research full-heartily and persistently, the applicant finally conceived a successive approximation analog-to-digital converter having an auxiliary prediction circuit and a method thereof.

SUMMARY OF THE INVENTION

It is therefore an object of the present invention to provide a successive approximation analog-to-digital converter having an auxiliary prediction circuit to avoid unnecessary capacitor switching such that 40% to 45% of the energy consumption of capacitor switching could be saved and the static and dynamic efficiencies of circuit could be improved.

According to the first aspect of the present invention, a successive approximation analog-to-digital converter comprises a positive and a negative input terminals, a capacitor array having at least one capacitor with a first and a second terminals, and a plurality of bits, counting from a most significant bit (MSB) to a least significant bit (LSB), wherein each of the plurality of bits electrically connects with the at least one capacitor, the first terminal electrically connects with one of the positive and negative input terminals, and the second terminal switchably connects with a first and a second reference voltage sources to selectively receive one of a first and a second reference voltages, a first comparator receiving an adjustable third reference voltage and electrically connected to the positive input terminal, wherein the second terminal of each the at least one capacitor is configured to be switched when a voltage on the positive terminal is larger than a third reference voltage, and a second comparator receiving the third reference voltage and electrically connected to the negative input terminal, wherein the second terminal of the at least one capacitor is configured to be switched when a voltage on the negative terminal is less than a negative value of the third reference voltage.

According to the second aspect of the present invention, a successive approximation analog-to-digital converter comprises a capacitor array having at least one capacitor with a first and a second terminals, and a plurality of bits, each of which is connected to the at least one capacitor, wherein the first terminal receives an input signal, and the second terminal selectively receives one of a first and a second reference voltages, and a first comparator receiving an adjustable third reference voltage and a first voltage value generated by the input signal, wherein a connection of the second terminal of each the capacitor of the capacitor array is switched when the first voltage value is larger than the third reference voltage.

According to the third aspect of the present invention, a method for adjusting a successive approximation analog-to-digital converter having at least one capacitor with a first and a second terminals, comprising steps of: providing a plurality of bits, each of which is connected to the at least one capacitor, wherein the first terminal receives an input signal, and the second terminal selectively receives one of a first and a second reference voltages; comparing a voltage generated by the input signal with a third reference voltage; switching a connection of the second terminal of each the capacitor when there is one of the two following cases where the first case is the voltage is larger than the third reference voltage while the second case is the voltage is less than a negative value of the third reference voltage; and adjusting the third reference voltage every time after a voltage comparison with the third reference voltage is executed.

The present invention may best be understood through the following descriptions with reference to the accompanying drawings, in which:

BRIEF DESCRIPTION OF THE DRAWINGS

FIGS. 4(a) to 4(d) respectively show an example of capacitor switching scheme for maintaining common mode voltage stability according to the second preferred embodiment of the present invention;

FIGS. 6(a) and 6(b) respectively show a schematic diagram of operational principles of four 3-bit full adders of SAR ADC and a schematic diagram of a digital calibration logic for the above-mentioned operational principles according to the second preferred embodiment of the present invention;

DETAILED DESCRIPTION OF THE PREFERRED EMBODIMENT

According to the first preferred embodiment of the present invention, a method for adjusting a successive approximation analog-to-digital converter (SAR ADC) having at least one capacitor with a first and a second terminals is provided and comprises steps of: providing a plurality of bits, each of which is connected to the at least one capacitor, wherein the first terminal receives an input signal, and the second terminal selectively receives one of a first and a second reference voltages; comparing a voltage generated by the input signal with a third reference voltage; switching a connection of the second terminal of each the capacitor when there is one of the two following cases where the first case is the voltage is larger than the third reference voltage while the second case is the voltage is less than a negative value of the third reference voltage; and adjusting the third reference voltage every time after a voltage comparison with the third reference voltage is executed.

The aforementioned method further comprises a step of: adjusting the third reference voltage to one half of a present value thereof every time after the comparison is executed, and then restoring the third reference voltage to an initial value thereof until each of a predetermined number of the plurality of bits has been adjusted once. And, the input signal is a differential signal, the converter comprises a positive and a negative input terminals receiving the differential signal, the voltage is a voltage difference between the positive input terminal and the negative input terminal and the converter is used to generate a digital code matched to the differential signal.

Figure 1:
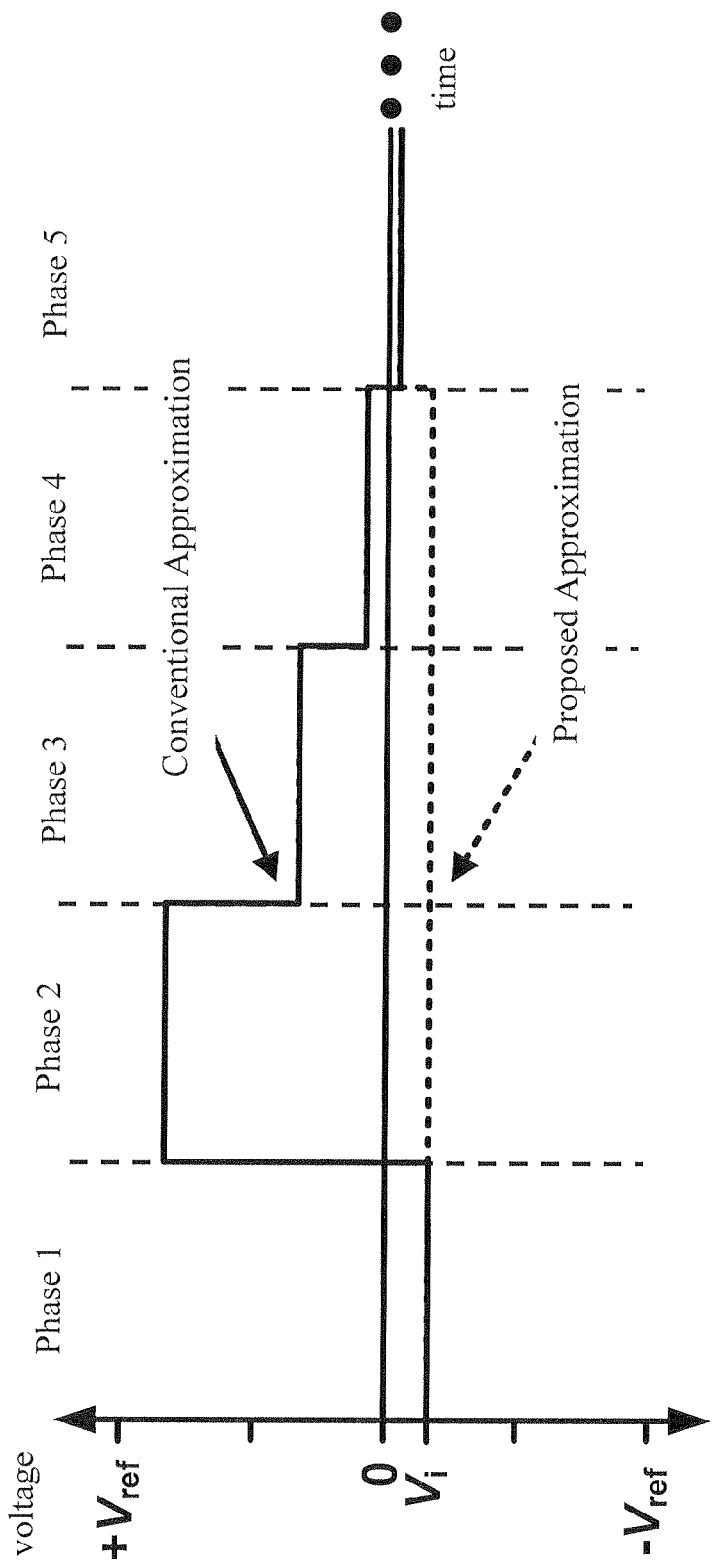
FIG. 1 is a schematic diagram of approximation of a conventional SAR ADC versus a proposed SAR ADC according to the first preferred embodiment of the present invention.

FIG. 1 is a schematic diagram of approximation of a conventional SAR ADC versus a SAR ADC according to the first preferred embodiment of the present invention. The proposed idea according to the first preferred embodiment of the present invention is shown in FIG. 1. When the signal is quite small, no capacitor switching will be engaged to avoid adding/subtracting any voltage to/from the DAC circuit in the SAR ADC unless it is impossible to reduce the input voltage Vi to less than an LSB during the remaining operations. An auxiliary prediction circuit is employed to ensure that the voltage difference will not become larger during the procedure of conversion, and the required actions could be accurately achieved when a capacitor switching is needed so as to efficiently decrease power consumptions.

Figure 2:
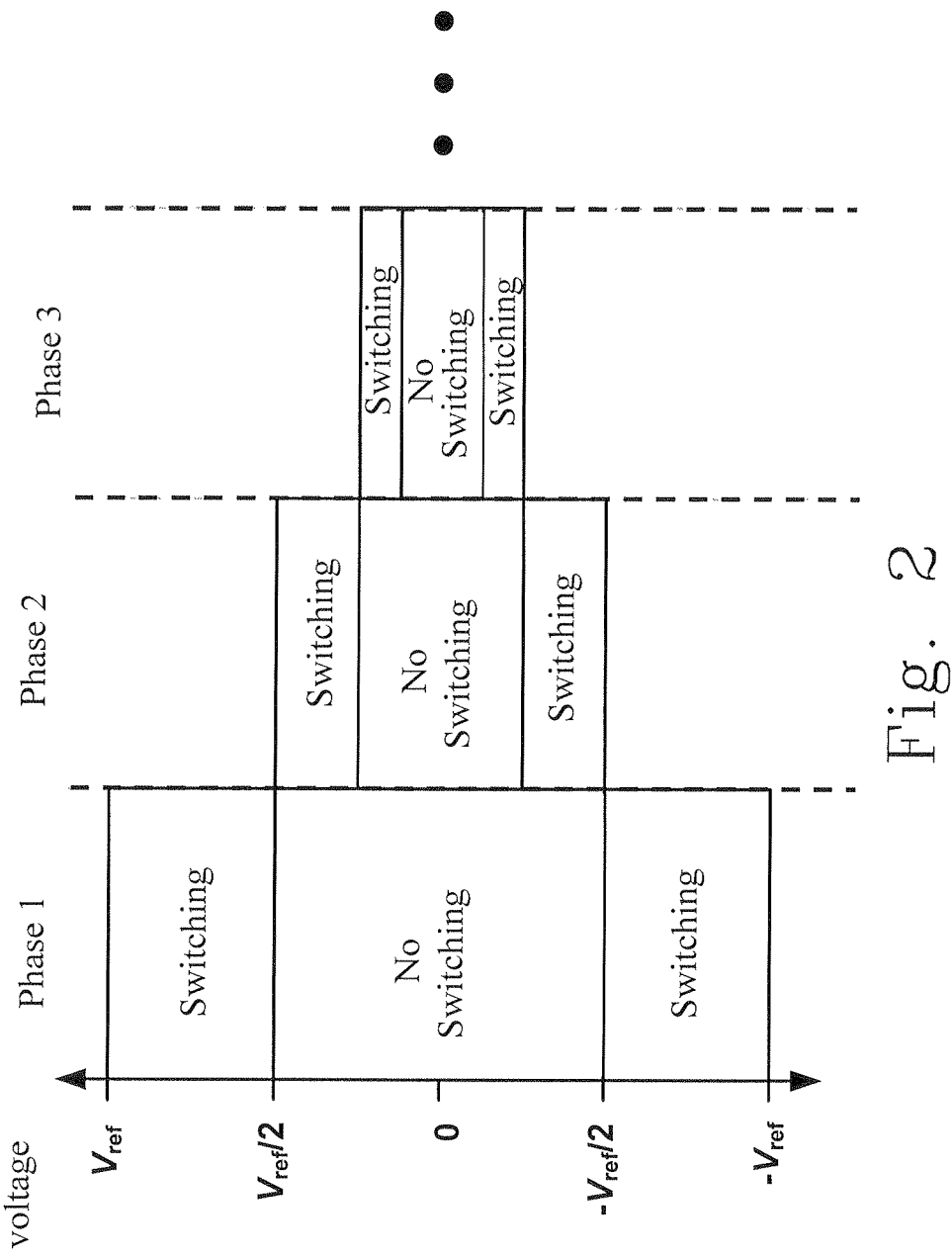
FIG. 2 is a schematic diagram depicting the idea of a method for avoiding unnecessary capacitor switching according to the first preferred embodiment of the present invention.

FIG. 2 is a schematic diagram depicting the idea of a method for avoiding unnecessary capacitor switching according to the first preferred embodiment of the present invention. Taking Phase 1 as an example, even though no capacitor switching will be engaged in this phase when the voltage difference of the input signal falls in the region of "No Switching" (e.g., within the range of −Vref/2 to Vref/2 in Phase 1), the voltage difference would be reduced to less than an LSB by the remaining operations later on. Thus, there will be no switching when the voltage difference of the input signal falls in the region of "No Switching". On the contrary, there has to be a switching when the voltage difference of the input signal falls in the region of "Switching" (e.g., within the ranges of −Vref to −Vref/2 and Vref/2 to Vref in Phase 1), otherwise, it is impossible for the voltage difference to be reduced to less than an LSB by the remaining operations later on.

Figure 3:
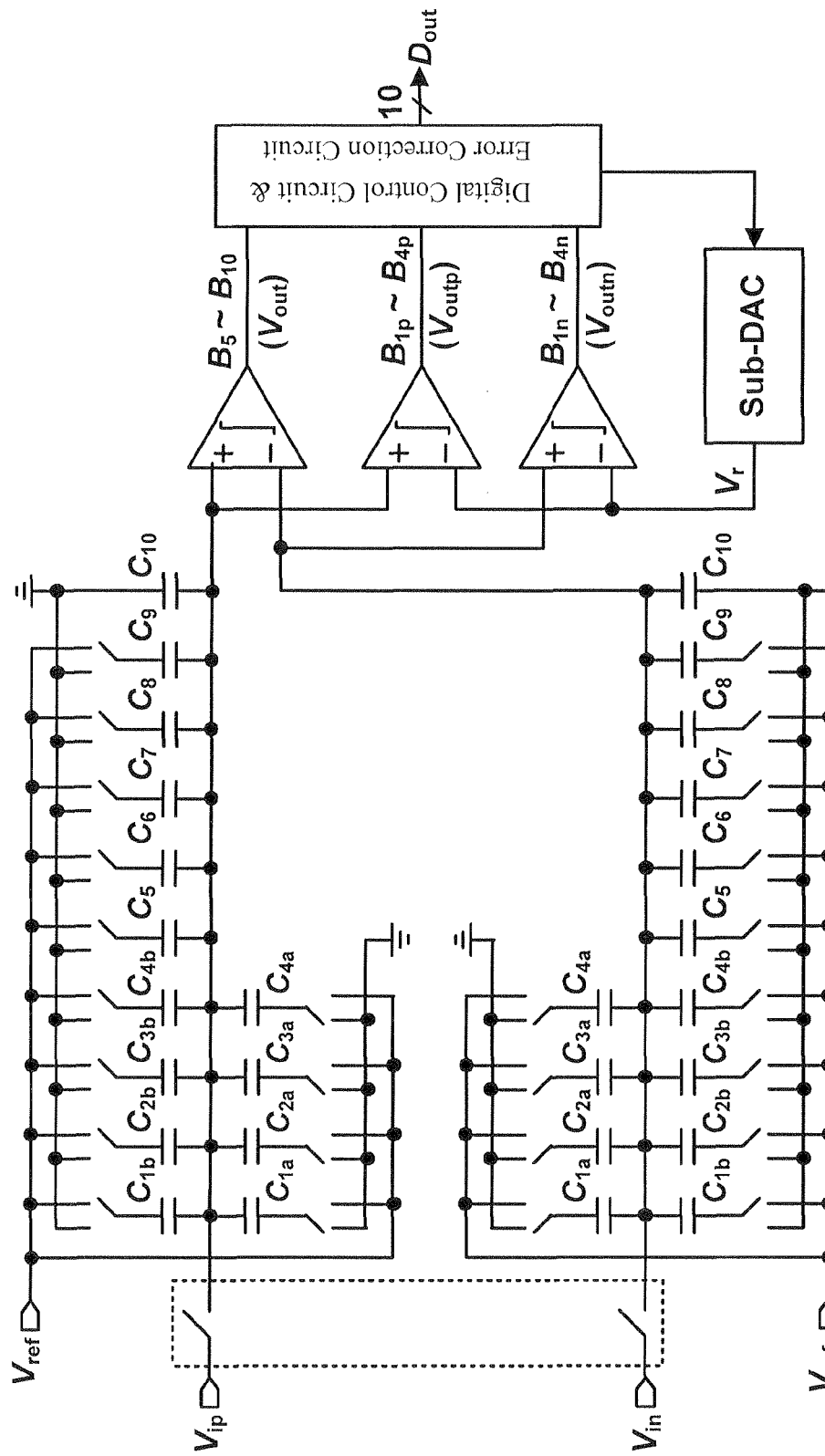
FIG. 3 is a schematic circuit diagram of a SAR ADC according to the second preferred embodiment of the present invention.

FIG. 3 is a circuit diagram of an SAR ADC according to the second preferred embodiment of the present invention. According to the second preferred embodiment of the present invention, an SAR ADC is provided and comprises a positive and a negative input terminals, a capacitor array having at least one capacitor with a first and a second terminals, and a plurality of bits, counting from a most significant bit (MSB) to a least significant bit (LSB), wherein each of the plurality of bits electrically connects with the at least one capacitor ($C_{ia}=2C_{(i+1)a}$, i=1-3; $C_{ja}=C_{jb}$, j=1-4; $C_k=2C_{(k+1)}$, k=5-8; $C_{4a}=C_5$, $C_9=C_{10}$), the first terminal electrically connects with one of the positive input terminal (receiving Vip) and the negative input terminal (receiving Vin), and the second terminal switchably connects with a first and a second reference voltage sources to selectively receive one of a first reference voltage (Vref) and a second reference voltage (zero potential (ground)), a first comparator receiving an adjustable third reference voltage Vr and electrically connected to the positive input terminal, wherein the second terminal of each the at least one capacitor is configured to be switched when a voltage on the positive terminal is larger than a third reference voltage Vr, and a second comparator receiving the third reference voltage Vr and electrically connected to the negative input terminal, wherein the second terminal of the at least one capacitor has a second connection, the second connection is configured to be switched when a voltage on the negative terminal is less than a negative value of the third reference voltage Vr.

As shown in FIG. 3, the SAR ADC further comprises a first and a second bootstrapped switches, a digital control circuit, an error correction circuit, a third comparator electrically connected to the positive and the negative input terminals and a sub-digital to analog converter (sub-DAC), wherein the positive and the negative input terminals receive an input signal, the input signal is a differential signal, the first and the second bootstrapped switches are respectively connected between the positive input terminal and the third comparator, and the negative input terminal and the third comparator for completely passing the differential signal through the positive and the negative input terminals, the third comparator is used to adjust the potential level of each of the remaining bits except for the predetermined number of the plurality of bits, the sub-DAC generates the adjustable third reference voltage, the digital control circuit and the error correction circuit electrically connect with the first, the second and the third comparators and the sub-DAC, and the digital control circuit and the error correction circuit generate a digital code matched to the input signal.

The above-mentioned third comparator has a comparison result, and the comparison result of the third comparator and a binary search algorithm are used to adjust the potential level of each of the remaining bits except for the predetermined number of the plurality of bits to generate the digital code, the third reference voltage is adjusted to one half of a present value thereof when the comparison result is generated, and the third reference voltage is restored to an initial value after all of the predetermined number of the plurality of bits are adjusted once. The predetermined number is K, K is an integer, N is a total number of output bits of the converter, K is not larger than N, and each of the $1^{st}$ to the $K^{th}$ bits has four capacitors, each of which has an equivalent capacitance.

FIG. 3 is a schematic circuit diagram of a SAR ADC having an auxiliary prediction circuit with a variable window function to decrease the unnecessary capacitor switching proposed in the present invention, that is to say, a new switching scheme is proposed to maintain the stability of the common mode voltage of the signal. At the left-hand side of the circuit as shown in FIG. 3, each of the largest four MSB capacitors is divided into two equivalent capacitors. During the sampling phase, the top plates of all the capacitors are sampling the input signal, the bottom plates of capacitors $C_{1a}$~$C_{4a}$ are connected to the zero potential (ground), the top plates of all the remaining capacitors ($C_{1b}$~$C_{4b}$ and $C_5$~$C_9$) are connected to the Vref. After that, the first to the third comparators are engaged in a first comparison. At the high-potential end, the capacitor $C_{1b}$ will be switched from the position of Vref to the position of zero potential, and the capacitor $C_{1a}$ is kept unchanged. At the low-potential end, the capacitor $C_{1a}$ will be switched from the position of zero potential to the position of Vref, and the capacitor $C_{1b}$ is kept unchanged.

FIGS. 4(a) to 4(d) respectively show an example of capacitor switching scheme for maintaining common mode voltage stability according to the second preferred embodiment of the present invention. Each of the capacitors has the probability of being switched, same as the original one, 50%. Thus, the average energy consumption of capacitor switching is the same as the conventional binary search algorithm. To avoid the overly complex control logic and layout routing, such a circuit technique is only used at the first four MSBs, and the switching of the remaining capacitors are still utilizing the aforementioned method of using the comparison result of the third comparator and a binary search algorithm to adjust the potential level of each of the remaining bits except the predetermined number of the plurality of bits. Therefore, the setoff amount of the common mode voltage of the input signal can be decreased to 1/16 of the original amount so that the dynamic setoff amount of the comparator has almost no influence to the efficiency of this 10-bit ADC.

Figures 5A, 5B:
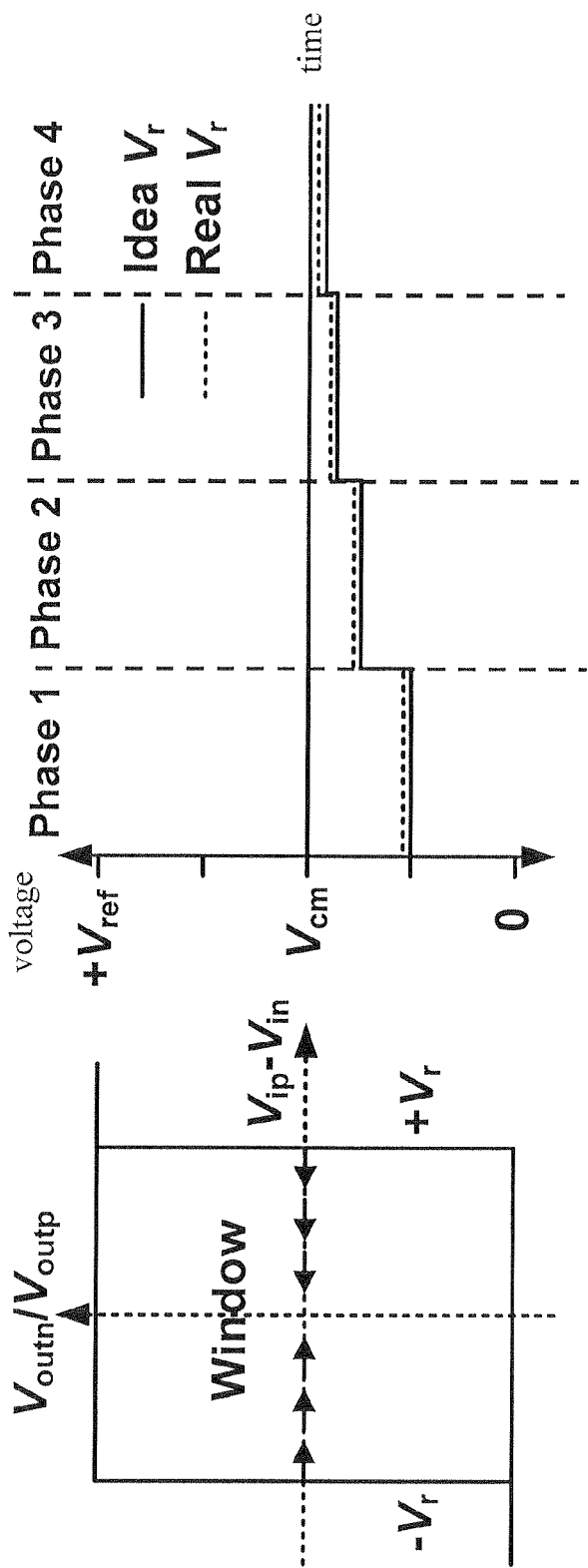
FIGS. 5(a) and 5(b) respectively show a schematic diagram of an example of variable window function of capacitor switching scheme for maintaining common mode voltage stability and a schematic diagram of voltage variation of Vr according to the second preferred embodiment of the present invention.

In the second preferred embodiment of the present invention, an auxiliary prediction circuit formed by the first and the second comparators (two coarse comparators) and the sub-DAC (as shown at the right-hand side of the circuit as shown in FIG. 3) is used to achieve the idea of avoiding the unnecessary switching of the capacitors as depicted in FIG. 2. To achieve that the window size in each of the bit cycles is different from that of the others, Vr must be variable. FIGS. 5(a) and 5(b) respectively show a schematic diagram of an example of variable window function of capacitor switching scheme for maintaining common mode voltage stability and a schematic diagram of voltage variation of Vr according to the second preferred embodiment of the present invention. In FIG. 5(a), the horizontal axis is the voltage difference Vip-Vin, and the vertical axis is the ratio of output voltage value of the second comparator over that of the first comparator: Voutn/Voutp. In FIG. 5(b), Vcm is the common mode voltage of the input signal. In the aforementioned second preferred embodiment of the present invention, a 6-bit sub-DAC is used to generate the variable Vr signal, the Vr voltage signal in the real design is higher than the ideal value for about 8 LSBs, and the real window size is smaller than the ideal value. Then, SAR ADC might have a margin of 8 LSBs to tolerate offset errors of the sub-DAC and coarse comparators. Since the resolution of the sub-DAC must be added by one more bit for each additional stage, only the first four stages of the MSB capacitors are using such an idea so as to achieve a better efficiency. Even though there is an extra 6-bit sub-DAC, this method for avoiding unnecessary capacitor switching could still decrease 40%-45% of the power consumptions of capacitor switching and switch buffer. Besides, since coarse comparator could have a quite large offset error, the size of the circuit does not required to be designed too big, the power consumption of the two coarse comparators of doing one comparison is lower than that of the third comparator (it is a fine comparator).

The above-mentioned SAR ADC further comprises K 3-bit full-adders, wherein: each of the K full adders is used to generate at least one digital code of the $1^{st}$ to the $(K+1)^{th}$ bits, the $K^{th}$ full adder adds a first output signal of the first comparator, an inverse value of a second output signal of the second comparator and a third output signal of the $(K+1)^{th}$ bit to generate the digital code of the $(K+1)^{th}$ bit when the $(K+1)^{th}$ bit is computed; when the $K^{th}$ bit is computed, the $(K-1)^{th}$ full adder adds a first output signal of the first comparator, an inverse value of a second output signal of the second comparator and a carry signal of the $K^{th}$ full adder to generate the digital code of the $K^{th}$ bit and this procedure is repeated until the 2nd bit is computed; the $1^{st}$ full adder adds a first output signal of the first comparator, an inverse value of a second output signal of the second comparator and a carry signal of the $2^{nd}$ full adder to generate the digital code of the $2^{nd}$ bit; and a carry signal of the $1^{st}$ adder is the digital code of the $1^{st}$ bit. FIGS. 6(a) and 6(b) respectively show a schematic diagram of operational principles of four 3-bit full adders of SAR ADC and a schematic diagram of digital calibration logic for the above-mentioned operational principles according to the second preferred embodiment of the present invention. As shown in FIGS. 6(a) and 6(b), only 4 3-bit full-adders are required to restore the correct digital code.

Naturally, the aforementioned second preferred embodiment of the present invention can be further generalized to generate the third preferred embodiment of the present invention, which is a successive approximation analog-to-digital converter comprises a capacitor array having at least one capacitor with a first and a second terminals, and a plurality of bits, each of which is connected to the at least one capacitor ($C_{ia}=2C(i+1)a$, $i=1$-$3$; $C_{ja}=C_{jb}$, $j=1$-$4$; $C_k=2C(k+1)$, $k=5$-$8$; $C_{4a}=C_5$, $C_9=C_{10}$), wherein the first terminal receives an input signal (Vip or Vin), and the second terminal selectively receives one of a first reference voltage (Vref) and a second reference voltage (zero potential), and a first comparator receiving an adjustable third reference voltage Vr and a first voltage value Vip generated by the input signal, wherein a connection of the second terminal of each the capacitor of the capacitor array is switched when the first voltage value Vip is larger than the third reference voltage Vr. The above-mentioned SAR ADC further comprises a second comparator receiving the third adjustable reference voltage Vr and a second voltage value Vin generated by the input signal, wherein a connection of the second terminal of each the capacitor of the capacitor array is switched when the second voltage value Vin is larger than the third reference voltage Vr.

Figures 7A, 7B:
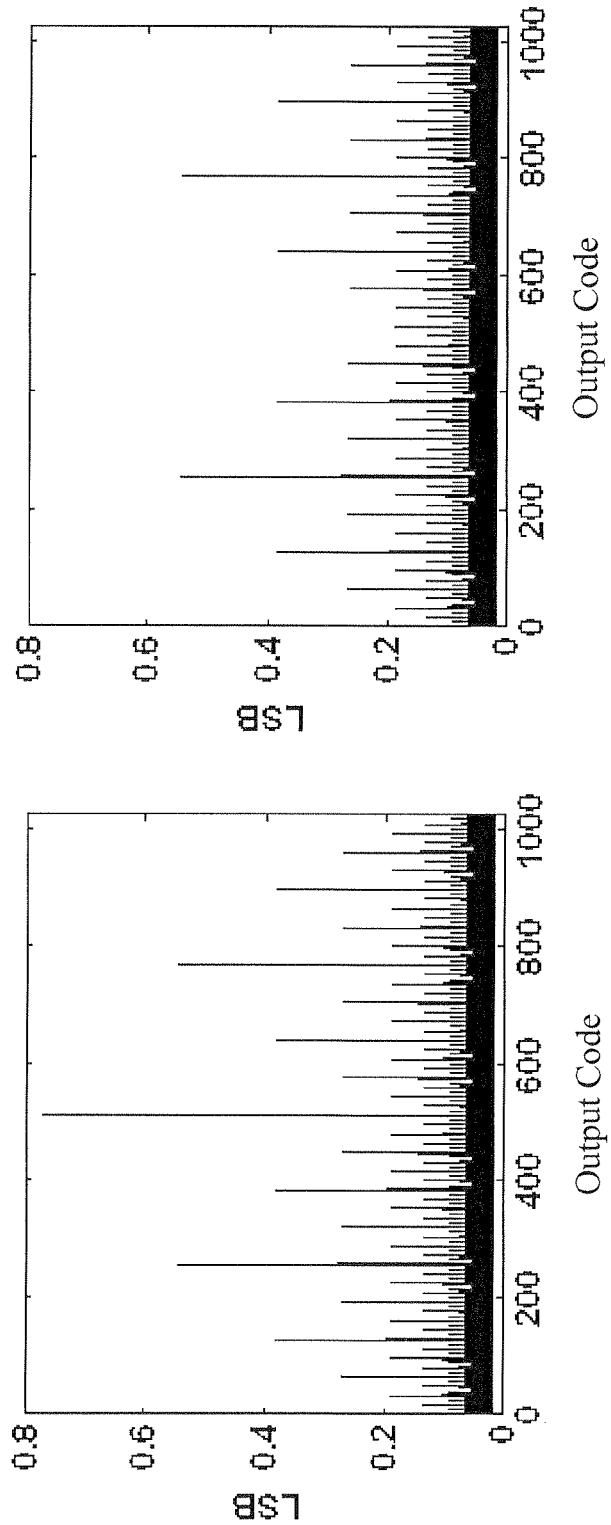
FIGS. 7(a) and 7(b) respectively show a schematic diagram of the average standard deviation of DNL of conventional SAR ADC and a schematic diagram of the average standard deviation of DNL of proposed SAR ADC according to the first preferred embodiment of the present invention.
Figures 7C, 7D:
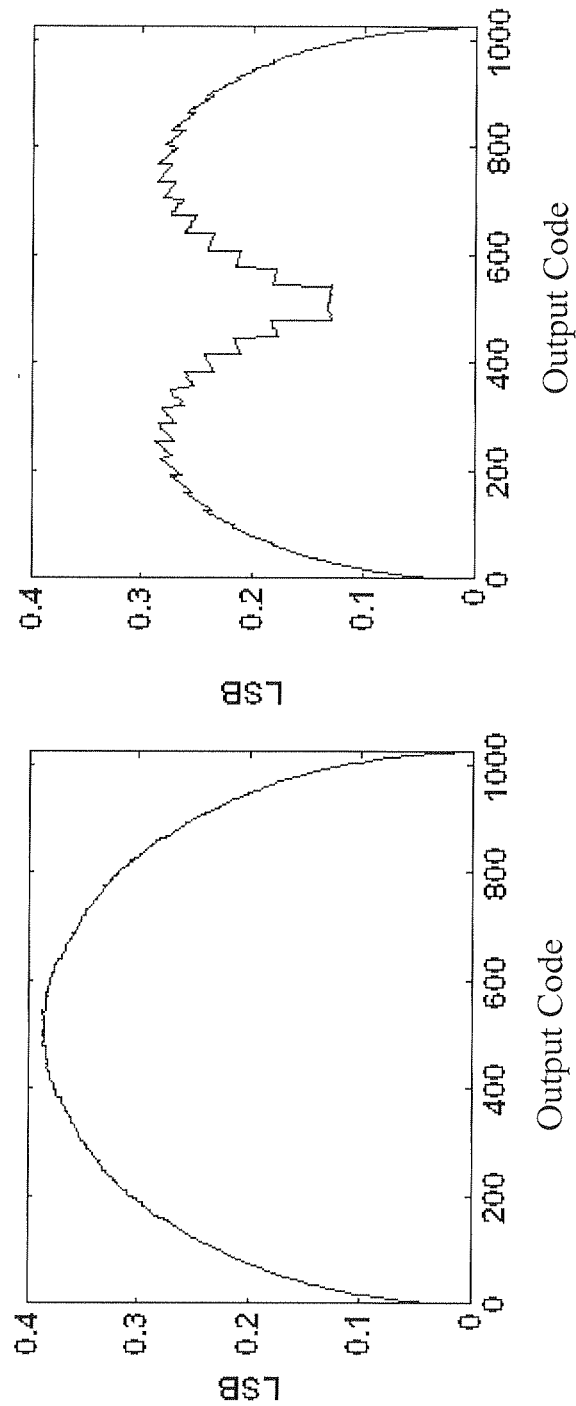
FIGS. 7(c) and 7(d) respectively show a schematic diagram of the average standard deviation of INL of conventional SAR ADC and a schematic diagram of the average standard deviation of INL of proposed SAR ADC according to the first preferred embodiment of the present invention.

FIGS. 7(a) and 7(b) respectively show a schematic diagram of the average standard deviation of DNL of conventional SAR ADC and a schematic diagram of the average standard deviation of DNL of proposed SAR ADC according to the first preferred embodiment of the present invention. FIGS. 7(c) and 7(d) respectively show a schematic diagram of the average standard deviation of INL of conventional SAR ADC and a schematic diagram of the average standard deviation of INL of proposed SAR ADC according to the first preferred embodiment of the present invention. The aforementioned four diagrams are the results of simulation and analysis by using the Matlab software. Assuming that there is a 3% mismatch for each the unit capacitor, there are in total 10,000 times of simulations being executed, the absolute value of the static efficiency of each simulation is taken and the average value of all these absolute values is calculated to generate the four diagrams. FIGS. 7(a) and 7(c) respectively show the static efficiency of conventional method, and FIGS. 7(b) and 7(d) respectively show static efficiency of the proposed method of the present invention. The proposed method of the present invention can decrease the probability that the capacitor is switched, and the first few MSB capacitors are almost not switched especially when the input signal is very close to zero. Observed from FIGS. 7(b) and 7(d), the static efficiency of circuit DNL (differential nonlinearity) and INL (integral nonlinearity) are improved significantly especially at the central portion of the digital output code. The linearity of the whole circuit will be raised also. Therefore, the technical measurement results are extraordinarily excellent no matter it is the static efficiency or the dynamic efficiency.

For example, A 10-bit, 10-MS/s SAR ADC using this method is implemented in a 0.18 μM 1P6M CMOS technology. The prototype consumes 98 μW from a 1-V supply and achieves an excellent ENOB of 9.83 bits. The resultant FOM is only 11 fJ/conversion-step.

EMBODIMENTS

1. A successive approximation analog-to-digital converter, comprising:
a positive and a negative input terminals;
a capacitor array having at least one capacitor with a first and a second terminals, and a plurality of bits, counting from a most significant bit (MSB) to a least significant bit (LSB), wherein each of the plurality of bits electrically connects with the at least one capacitor, the first terminal electrically connects with one of the positive input terminal and the negative input terminal, and the second terminal switchably connects with a first and a second reference voltage sources to selectively receive one of a first reference voltage and a second reference voltage;
a first comparator receiving an adjustable third reference voltage and electrically connected to the positive input terminal, wherein the second terminal of each the at least one capacitor is configured to be switched when a voltage on the positive terminal is larger than a third reference voltage; and
a second comparator receiving the third reference voltage and electrically connected to the negative input terminal, wherein the second terminal of the at least one capacitor is configured to be switched when a voltage on the negative terminal is less than a negative value of the third reference voltage.

2. A converter according to Embodiment 1 further comprising a first and a second bootstrapped switches, a digital control circuit, an error correction circuit, a third comparator electrically connected to the positive and the negative input terminals and a sub-digital to analog converter (sub-DAC), wherein the positive and the negative input terminals receive an input signal, the input signal is a differential signal, the first and the second bootstrapped switches are respectively connected between the positive input terminal and the third comparator, and the negative input terminal and the third comparator for completely passing the differential signal through the positive and the negative input terminals, the third comparator is used to adjust the potential level of each of the remaining bits except for the predetermined number of the plurality of bits, the sub-DAC generates the adjustable third reference voltage, the digital control circuit and the error correction circuit electrically connect with the first, the second and the third comparators and the sub-DAC, and the digital control circuit and the error correction circuit generate a digital code matched to the input signal.

3. A converter according to Embodiment 1 or 2, wherein the third comparator has a comparison result, and the comparison result of the third comparator and a binary search algorithm are used to adjust the potential level of each of the remaining bits except for the predetermined number of the plurality of bits to generate the digital code, the third reference voltage is adjusted to one half of a present value thereof when the comparison result is generated, and the third reference voltage is restored to an initial value after all of the predetermined number of the plurality of bits are adjusted once.

4. A converter according to anyone of the above-mentioned Embodiments, wherein the predetermined number is K, K is an integer, N is a total number of output bits of the converter, K is not larger than N, and each of the $1^{st}$ to the $K^{th}$ bits has four capacitors, each of which has an equivalent capacitance.

5. A converter according to anyone of the above-mentioned Embodiments further comprising K 3-bit full adders, wherein:
each of the K full adders is used to generate at least one digital code of the $1^{st}$ to the $(K+1)^{th}$ bits, the $K^{th}$ full adder adds a first output signal of the first comparator, an inverse value of a second output signal of the second comparator and a third output signal of the $(K+1)^{th}$ bit to generate the digital code of the $(K+1)^{th}$ bit when the $(K+1)^{th}$ bit is computed;
when the $K^{th}$ bit is computed, the $(K-1)^{th}$ full adder adds a first output signal of the first comparator, an inverse value of a second output signal of the second comparator and a carry signal of the $K^{th}$ full adder to generate the digital code of the $K^{th}$ bit and this procedure is repeated until the $2^{nd}$ bit is computed;
the $1^{st}$ full adder adds a first output signal of the first comparator, an inverse value of a second output signal of the second comparator and a carry signal of the $2^{nd}$ full adder to generate the digital code of the $2^{nd}$ bit; and
a carry signal of the $1^{st}$ adder is the digital code of the $1^{st}$ bit.

6. A successive approximation analog-to-digital converter, comprising:
a capacitor array having at least one capacitor with a first and a second terminals, and a plurality of bits, each of which is connected to the at least one capacitor, wherein the first terminal receives an input signal, and the second terminal selectively receives one of a first and a second reference voltages; and
a first comparator receiving an adjustable third reference voltage and a first voltage value generated by the input signal, wherein a connection of the second terminal of each the capacitor of the capacitor array is switched when the first voltage value is larger than the third reference voltage.

7. A converter according to Embodiment 6 further comprising a second comparator receiving the third adjustable reference voltage and a second voltage value generated by the input signal, wherein a connection of the second terminal of each the capacitor of the capacitor array is switched when the second voltage value is larger than the third reference voltage.

8. A converter according to Embodiment 6 or 7 further comprising a positive and a negative input terminals receiving the input signal, a first and a second bootstrapped switches, a digital control circuit, an error correction circuit, a third comparator electrically connected to the positive and the negative input terminals and a sub-digital to analog converter (sub-DAC), wherein the first and the second comparators are used to adjust respective potential levels of a predetermined number of the plurality of bits from a most significant byte (MSB) to a least significant byte (LSB), the input signal is a differential signal, the first and the second bootstrapped switches are respectively connected between the positive input terminal and the third comparator, and the negative input terminal and the third comparator for completely passing the differential signal through the positive and the negative input terminals, the third comparator is used to adjust the respective potential level of each of the remaining bits except for the predetermined number of the plurality of bits, the sub-DAC generates the adjustable third reference voltage, the digital control circuit and the error correction circuit electrically connect with the first, the second and the third comparators and the sub-DAC, and the digital control circuit and the error correction circuit generate a digital code matched to the input signal.

9. A converter according to anyone of the above-mentioned Embodiments, wherein a comparison result of the third comparator and a binary search algorithm are used to adjust the potential level of each of the remaining bits except for the predetermined number of the plurality of bits, the third reference voltage is adjusted to one half of a present value thereof when the comparison result is generated, and the third reference voltage is restored to an initial value when all of the predetermined number of the plurality of bits are adjusted once.

10. A converter according to anyone of the above-mentioned Embodiments, wherein the predetermined number is K, K is an integer, N is a total number of output bits of the converter, K is not larger than N, and each of the $1^{st}$ to the $K^{th}$ bits has four capacitors, each of which has an equivalent capacitance.

11. A converter according to anyone of the above-mentioned Embodiments further comprising K 3-bit full adders.

12. A method for adjusting a successive approximation analog-to-digital converter having at least one capacitor with a first and a second terminals, comprising steps of:

providing a plurality of bits, each of which is connected to the at least one capacitor, wherein the first terminal receives an input signal, and the second terminal selectively receives one of a first and a second reference voltages;

comparing a voltage generated by the input signal with a third reference voltage;

switching a connection of the second terminal of each the capacitor when there is one of the two following cases where the first case is the voltage is larger than the third reference voltage while the second case is the voltage is less than a negative value of the third reference voltage; and adjusting the third reference voltage every time after a voltage comparison with the third reference voltage is executed.

13. A method according to Embodiment 12, wherein the adjusting step further comprises a step of: adjusting the third reference voltage to one half of a present value thereof every time after the comparison is executed, and then restoring the third reference voltage to an initial value thereof until each of a predetermined number of the plurality of bits has been adjusted once.

14. A method according to Embodiment 11 or 12, wherein the input signal is a differential signal, the converter comprises a positive and a negative input terminals receiving the differential signal, the voltage is a voltage difference between the positive input terminal and the negative input terminal and the converter is used to generate a digital code matched to the differential signal.

According to the aforementioned descriptions, the present invention provides a successive approximation analog-to-digital converter having an auxiliary prediction circuit to avoid unnecessary capacitor switching such that 40% to 45% of the energy consumption of capacitor switching could be saved and the static and dynamic efficiencies of circuit could be improved so as to possess the non-obviousness and the novelty.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A successive approximation analog-to-digital converter, comprising:

a positive and a negative input terminals;

a capacitor array having at least one capacitor with a first and a second terminals, and a plurality of bits, counting from a most significant bit (MSB) to a least significant bit (LSB), wherein each of the plurality of bits electrically connects with the at least one capacitor, the first terminal electrically connects with one of the positive input terminal and the negative input terminal, and the second terminal switchably connects with a first and a second reference voltage sources to selectively receive one of a first reference voltage and a second reference voltage;

a first comparator receiving an adjustable third reference voltage and electrically connected to the positive input terminal, wherein the second terminal of each the at least one capacitor is configured to be switched when the voltage on the positive terminal is larger than a third reference voltage; and a second comparator receiving the third reference voltage and electrically connected to the negative input terminal, wherein the second terminal of the at least one capacitor is configured to be switched when the voltage on the negative terminal is less than a negative value of the third reference voltage.

2. A converter according to claim 1 further comprising a first and a second bootstrapped switches, a digital control circuit, an error correction circuit, a third comparator electrically connected to the positive and the negative input terminals and a sub-digital to analog converter (sub-DAC), wherein the positive and the negative input terminals receive an input signal, the input signal is a differential signal, the first and the second bootstrapped switches are respectively connected between the positive input terminal and the third comparator, and the negative input terminal and the third comparator for completely passing the differential signal through the positive and the negative input terminals, the third comparator is used to adjust the potential level of each of the remaining bits except for the predetermined number of the plurality of bits, the sub-DAC generates the adjustable third reference voltage, the digital control circuit and the error correction circuit electrically connect with the first, the second and the third comparators and the sub-DAC, and the digital control circuit and the error correction circuit generate a digital code matched to the input signal.

3. A converter according to claim 2, wherein the third comparator has a comparison result, and the comparison result of the third comparator and a binary search algorithm are used to adjust the potential level of each of the remaining bits except for the predetermined number of the plurality of bits to generate the digital code, the third reference voltage is adjusted to one half of a present value thereof when the comparison result is generated, and the third reference voltage is restored to an initial value after all of the predetermined number of the plurality of bits are adjusted once.

4. A converter according to claim 1, wherein the predetermined number is K, K is an integer, N is a total number of output bits of the converter, K is not larger than N, and each of the $1^{st}$ to the $K^{th}$ bits has four capacitors, each of which has an equivalent capacitance.

5. A converter according to claim 4 further comprising K 3-bit full adders, wherein:
 each of the K full adders is used to generate at least one digital code of the $1^{st}$ to the $(K+1)^{th}$ bits, the $K^{th}$ full adder adds a first output signal of the first comparator, an inverse value of a second output signal of the second comparator and a third output signal of the $(K+1)^{th}$ bit to generate the digital code of the $(K+1)^{th}$ bit when the $(K+1)^{th}$ bit is computed;
 when the $K^{th}$ bit is computed, the $(K-1)^{th}$ full adder adds a first output signal of the first comparator, an inverse value of a second output signal of the second comparator and a carry signal of the $K^{th}$ full adder to generate the digital code of the $K^{th}$ bit and this procedure is repeated until the $2^{nd}$ bit is computed;
 the $1^{st}$ full adder adds a first output signal of the first comparator, an inverse value of a second output signal of the second comparator and a carry signal of the 2nd full adder to generate the digital code of the $2^{nd}$ bit; and
 a carry signal of the $1^{st}$ adder is the digital code of the $1^{st}$ bit.

6. A successive approximation analog-to-digital converter, comprising:
 a capacitor array having at least one capacitor with a first and a second terminals, and a plurality of bits, each of which is connected to the at least one capacitor, wherein the first terminal receives an input signal, and the second terminal selectively receives one of a first and a second reference voltages; and
 a first comparator receiving an adjustable third reference voltage and a first voltage value generated by the input signal, wherein a connection of the second terminal of each the capacitor of the capacitor array is switched when the first voltage value is larger than the third reference voltage.

7. A converter according to claim 6 further comprising a second comparator receiving the third adjustable reference voltage and a second voltage value generated by the input signal, wherein a connection of the second terminal of each the capacitor of the capacitor array is switched when the second voltage value is larger than the third reference voltage.

8. A converter according to claim 7 further comprising a positive and a negative input terminals receiving the input signal, a first and a second bootstrapped switches, a digital control circuit, an error correction circuit, a third comparator electrically connected to the positive and the negative input terminals and a sub-digital to analog converter (sub-DAC), wherein the first and the second comparators are used to adjust respective potential levels of a predetermined number of the plurality of bits from a most significant byte (MSB) to a least significant byte (LSB), the input signal is a differential signal, the first and the second bootstrapped switches are respectively connected between the positive input terminal and the third comparator, and the negative input terminal and the third comparator for completely passing the differential signal through the positive and the negative input terminals, the third comparator is used to adjust the respective potential level of each of the remaining bits except for the predetermined number of the plurality of bits, the sub-DAC generates the adjustable third reference voltage, the digital control circuit and the error correction circuit electrically connect with the first, the second and the third comparators and the sub-DAC, and the digital control circuit and the error correction circuit generate a digital code matched to the input signal.

9. A converter according to claim 8, wherein a comparison result of the third comparator and a binary search algorithm are used to adjust the potential level of each of the remaining bits except for the predetermined number of the plurality of bits, the third reference voltage is adjusted to one half of a present value thereof when the comparison result is generated, and the third reference voltage is restored to an initial value when all of the predetermined number of the plurality of bits are adjusted once.

10. A converter according to claim 8, wherein the predetermined number is K, K is an integer, N is a total number of output bits of the converter, K is not larger than N, and each of the $1^{st}$ to the $K^{th}$ bits has four capacitors, each of which has an equivalent capacitance.

11. A converter according to claim 10 further comprising K 3-bit full adders.

12. A method for adjusting a successive approximation analog-to-digital converter having at least one capacitor with a first and a second terminals, comprising steps of:
 providing a plurality of bits, each of which is connected to the at least one capacitor, wherein the first terminal receives an input signal, and the second terminal selectively receives one of a first and a second reference voltages;
 comparing a voltage generated by the input signal with a third reference voltage;
 switching a connection of the second terminal of each the capacitor when there is one of the two following cases where the first case is the voltage is larger than the third reference voltage while the second case is the voltage is less than a negative value of the third reference voltage; and
 adjusting the third reference voltage every time after a voltage comparison with the third reference voltage is executed.

13. A method according to claim 12, wherein the adjusting step further comprises a step of: adjusting the third reference voltage to one half of a present value thereof every time after the comparison is executed, and then restoring the third reference voltage to an initial value thereof until each of a predetermined number of the plurality of bits has been adjusted once.

14. A method according to claim 12, wherein the input signal is a differential signal, the converter comprises a positive and a negative input terminals receiving the differential signal, the voltage is a voltage difference between the positive input terminal and the negative input terminal and the converter is used to generate a digital code matched to the differential signal.

* * * * *